(12) United States Patent
Prabha et al.

(10) Patent No.: US 12,456,971 B2
(45) Date of Patent: Oct. 28, 2025

(54) METHOD AND APPARATUS FOR LIMITING MINORITY CARRIER INJECTION

(71) Applicant: Allegro MicroSystems, LLC, Manchester, NH (US)

(72) Inventors: Rajiv Damodaran Prabha, Nashua, NH (US); David Abramson, Stratham, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 144 days.

(21) Appl. No.: 18/524,664

(22) Filed: Nov. 30, 2023

(65) Prior Publication Data
US 2025/0183884 A1   Jun. 5, 2025

(51) Int. Cl.
*H03K 17/06* (2006.01)
*H03K 17/082* (2006.01)
*H03K 17/687* (2006.01)

(52) U.S. Cl.
CPC ....... *H03K 17/063* (2013.01); *H03K 17/0822* (2013.01); *H03K 17/687* (2013.01); *H03K 2217/0036* (2013.01)

(58) Field of Classification Search
CPC ............. H03K 17/063; H03K 17/0822; H03K 17/687; H03K 2217/0036
USPC ................................................ 327/108–112
See application file for complete search history.

(56) References Cited

U.S. PATENT DOCUMENTS

| | | |
|---|---|---|
| 5,264,782 A | 11/1993 | Newton |
| 6,982,527 B2 | 1/2006 | Lee et al. |
| 7,675,245 B2 | 3/2010 | Szczeszynski et al. |
| 7,999,487 B2 | 8/2011 | Szczeszynski |
| 8,169,161 B2 | 5/2012 | Szczeszynski et al. |
| 8,339,049 B2 | 12/2012 | Kang et al. |

(Continued)

FOREIGN PATENT DOCUMENTS

| | | |
|---|---|---|
| EP | 2 723 146 A1 | 4/2014 |
| JP | 2013-132107 | 7/2013 |

OTHER PUBLICATIONS

Allegro MicroSystems, LLC datasheet (ALT80800 Automotive-Grade, Constant-Current 2.0 A PWM Dimmable Synchronous Buck LED Driver), Nov. 29, 2021, 23 pages.

(Continued)

*Primary Examiner* — Menatoallah Youssef
*Assistant Examiner* — Colleen J O Toole
(74) *Attorney, Agent, or Firm* — Daly, Crowley, Mofford & Durkee, LLP

(57) ABSTRACT

A driver circuit comprising: a substrate; a first terminal; a second terminal; a switching circuit that is formed on the substrate, the switching circuit including a first switch and a second switch, the first switch having a first drain and a first source, the second switch having a second drain and a second source, the first drain being coupled to the first terminal, the first source being coupled to the second drain, the second source being coupled to ground, and the second terminal being coupled to the first source and the second drain; an electrostatic discharge (ESD) diode that is formed on the substrate; a trigger circuit that is formed on the substrate, the trigger circuit being configured to divert a first electrical current when the trigger circuit is activated, the first electrical current being diverted from the second terminal to the first terminal via the first switch.

25 Claims, 6 Drawing Sheets

(56) References Cited

U.S. PATENT DOCUMENTS

| | | |
|---|---|---|
| 8,456,105 B2 | 6/2013 | Wang et al. |
| 8,482,225 B2 | 7/2013 | Szczeszynski |
| 8,519,630 B2 | 8/2013 | Wang et al. |
| 8,610,371 B2 | 12/2013 | Lee et al. |
| 8,624,828 B2 | 1/2014 | Uchimoto et al. |
| 8,664,930 B2 | 3/2014 | Kang et al. |
| 8,670,252 B2 | 3/2014 | Kim et al. |
| 8,692,482 B2 | 4/2014 | Szczeszynski et al. |
| 8,742,682 B1 | 6/2014 | Wang et al. |
| 8,779,805 B1 | 7/2014 | Fernandez et al. |
| 8,901,835 B2 | 12/2014 | Kang et al. |
| 8,937,433 B1 | 1/2015 | Wang et al. |
| 9,265,104 B2 | 2/2016 | Szczeszynski et al. |
| 9,294,084 B1 | 3/2016 | McIntosh et al. |
| 9,379,708 B2 | 6/2016 | Martin et al. |
| 9,615,413 B2 | 4/2017 | Raval et al. |
| 9,774,257 B2 | 9/2017 | Wibben et al. |
| 11,272,591 B1 | 3/2022 | Lee |
| 2007/0222739 A1 | 9/2007 | Yu et al. |
| 2008/0084196 A1 | 4/2008 | Lacombe et al. |
| 2010/0156382 A1 | 6/2010 | Gotoh |
| 2010/0271742 A1* | 10/2010 | Shannon ............... H02H 9/046 |
| | | 324/537 |
| 2010/0289424 A1 | 11/2010 | Chang et al. |
| 2010/0308026 A1 | 12/2010 | Vogel |
| 2011/0285658 A1 | 11/2011 | Homma et al. |
| 2012/0286687 A1 | 11/2012 | Kikuchi et al. |
| 2013/0009556 A1 | 1/2013 | Szczeszynski et al. |
| 2013/0009557 A1 | 1/2013 | Szczeszynski |
| 2014/0084884 A1 | 3/2014 | Lee |
| 2014/0217999 A1 | 8/2014 | Wibben et al. |
| 2014/0253072 A1 | 9/2014 | Hussien et al. |
| 2017/0365995 A1* | 12/2017 | Bahl .................... H02H 1/0007 |

OTHER PUBLICATIONS

PCT Search Report and Written Opinion of the ISA dated Aug. 20, 2015; for PCT Application No. PCT/US2015/020057; 10 pages.
International Preliminary Report on Patentability dated Dec. 8, 2016 for PCT Application No. PCT/US2015/020057; 8 pages.
Restriction Requirement dated Jun. 23, 2016 for U.S. Appl. No. 14/620,656, 5 pages.
Response to Restriction Requirement dated Jun. 23, 2016, filed on Jun. 24, 2016, for U.S. Appl. No. 14/620,656, 1 pages.
Office Action dated Jul. 28, 2016 for U.S. Appl. No. 14/620,656, 9 pages.
Response to Office Action dated Jul. 28, 2016, filed on Oct. 4, 2016 for U.S. Appl. No. 14/620,656, 9 pages.
Final Office Action dated Nov. 10, 2016 for U.S. Appl. No. 14/620,656, 14 pages.
Response to Final Office Action dated Nov. 10, 2016, filed on Jan. 9, 2017 for U.S. Appl. No. 14/620,656, 10 pages.
Office Action dated Feb. 7, 2017 for U.S. Appl. No. 14/620,656, 9 pages.
Response to Office Action dated Feb. 7, 2017, filed on Apr. 11, 2017, for U.S. Appl. No. 14/620,656, 10 pages.
Final Office Action dated Apr. 27, 2017 for U.S. Appl. No. 14/620,656, 9 pages.
Response to Final Office Action dated Apr. 27, 2017, filed on Jun. 5, 2017 for U.S. Appl. No. 14/620,656, 8 pages.
Notice of Allowance dated Jun. 21, 2017 for U.S. Appl. No. 14/620,656, 9 pages.
European Response to Rules 161 (1) and 162 Communication filed on Jun. 16, 2017 for European Application No. 15712009.8, 18 pages.
European Examination Report dated Feb. 2, 2018 for European Application No. 15712009.8, 5 pages.
Response to European Examination Report dated Feb. 2, 2018, filed on May 30, 2018 for European Application No. 15712009.8, 16 pages.
European Examination Report dated Nov. 16, 2018 for European Application No. 15712009.8, 6 pages.
Response to European Examination Report dated Nov. 16, 2018, filed on May 24, 2019 for European Application No. 15712009.8, 18 pages.
Intention to Grant dated Feb. 3, 2020 for European Application No. 15712009.8, 7 pages.
Japanese Office Action dated Oct. 29, 2018 with English translation for Japanese Application No. 2017-514258, 11 pages.
Response to Japanese Office Action dated Oct. 29, 2018, filed on Jan. 9, 2019 with English translation for Japanese Application No. 2017-514258, 8 pages.
Japanese Notice of Allowance dated Mar. 18, 2019 with English translation for Japanese Application No. 2017-514258, 5 pages.
Korean Office Action dated Aug. 27, 2020 with English translation for Korean Application No. 10-2016-7033556, 15 pages.
Response to Korean Office Action dated Aug. 27, 2020, filed on Sep. 29, 2020 with English translation for Korean Application No. 10-2016-7033556, 32 pages.
Korean Notice of Allowance dated Jan. 28, 2021 with English translation for for Korean Application No. 10-2016-7033556, 3 pages.

* cited by examiner

METHOD AND APPARATUS FOR LIMITING MINORITY CARRIER INJECTION

BACKGROUND

Minority carrier injection refers to a phenomenon in semiconductor physics where an excess of charge carriers, which are either electrons or holes, is introduced into a region of a semiconductor material where these carriers are typically present in lower concentrations. This injection of minority carriers is often achieved through external means, such as applying a bias voltage across specialized structures like p-n junctions. When excessive carriers are injected, they can create localized regions of high charge density, causing unintended changes in the electrical characteristics of the semiconductor material. These changes can lead to increased leakage currents, altered device performance, and even permanent damage to the component's structure or properties.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a driver circuit is provided comprising: a substrate; a first terminal; a second terminal; a switching circuit that is formed on the substrate, the switching circuit including a first switch and a second switch, the first switch having a first drain and a first source, the second switch having a second drain and a second source, the first drain being coupled to the first terminal, the first source being coupled to the second drain, the second source being coupled to ground, and the second terminal being coupled to the first source and the second drain; an electrostatic discharge (ESD) diode that is formed on the substrate; a trigger circuit that is formed on the substrate, the trigger circuit being configured to divert a first electrical current when the trigger circuit is activated, the first electrical current being diverted from the second terminal to the first terminal via the first switch; a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT.

According to aspects of the disclosure, a driver circuit is provided, comprising: a substrate; an input voltage terminal; a switched output terminal; a switching circuit that is formed on the substrate, the switching circuit being configured to receive an input voltage at the input voltage terminal and output a pulse width modulated (PWM) signal on the switched output terminal; an electrostatic discharge (ESD) protection diode that is formed on the substrate; a trigger circuit that is formed on the substrate, the trigger circuit being configured to cause the switching circuit to conduct a first electrical current from the switched output terminal to the input voltage terminal when the trigger circuit is activated; and a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT.

According to aspects of the disclosure, a method is provided for use in a driver circuit, the driver circuit including a switching circuit that is coupled between an input voltage terminal and switched output terminal of the driver circuit, the switching circuit including a first switch and a second switch, the method comprising: sensing an injection current by using a parasitic bipolar junction transistor (BJT) that is formed by using: (i) a substrate of the driver circuit, (ii) an electrostatic discharge (ESD) diode of the driver circuit, and (iii) a detector transistor that is formed on the substrate; and activating, by the parasitic BJT, a trigger circuit in response to the injection current exceeding a first threshold, wherein activating the trigger circuit includes transitioning an output of the trigger circuit from a first value to a second value; and turning off a second switch that is part of the switch circuit in response to the output of the trigger circuit transitioning to the second value, wherein turning off the second switch, at least in part, causes an inductor current to be diverted from the switched output terminal to the input voltage terminal via a first switch that is part of the switching circuit thereby reducing the inductor current.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1:
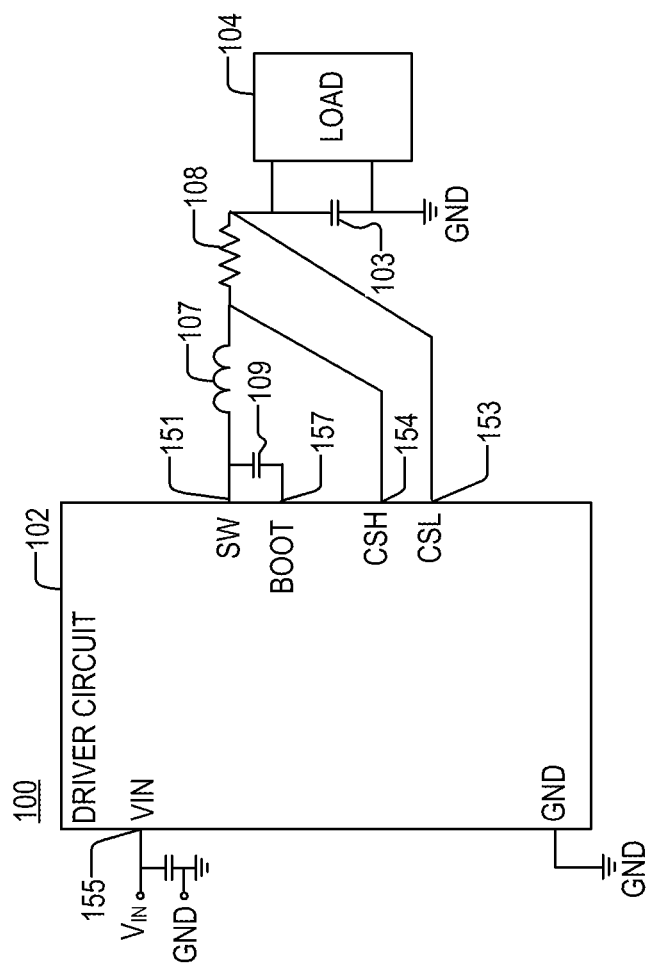
FIG. 1 is a diagram of an example of a system, according to aspects of the disclosure.

FIG. 1 is a diagram illustrating an example of a system 100 including a driver circuit 102 that is arranged to drive a load 104. The driver circuit 102 is arranged to receive power at a voltage input terminal 155 and drive the load 104 with the received power. Specifically, the driver circuit 102 may output a pulse width modulated (PWM) signal on a switched output terminal 151, which signal is subsequently used to drive the load 104. Coupled between the load 104 and driver circuit 102 may be an inductor 107 which provides filtering of the PWM signal and a resistor 108 to sense the inductor current. The inductor 107 and the resistor 108 may be coupled in series between the switched output terminal 151 and current sense terminals 153 and 154. A boot capacitor 109 may be coupled between the switched output terminal 151 and a boot terminal 157. The current sense terminal 154 may be coupled to the cathode of an electrostatic discharge (ESD) diode 144 (shown in FIG. 2). Although in the example of FIG. 1A, a diode is used as an electrostatic discharge device, alternative implementations are possible in which a grounded gate metal-oxide-semiconductor field-effect transistor (MOSFET) or a bipolar junction transistor (BJT) may be used instead of the ESD diode 144 as an electrostatic discharge device. The anode of the ESD diode 144 may be coupled to ground. The load 104 may be coupled in parallel with a capacitor 103 between resistor 108 and ground. The load 104 may include a light-emitting diode (LED), an LED array, a motor, and/or any other suitable type of load. The present disclosure is not limited to the driver circuit 102 being used to drive any specific type of load.

Figure 2:
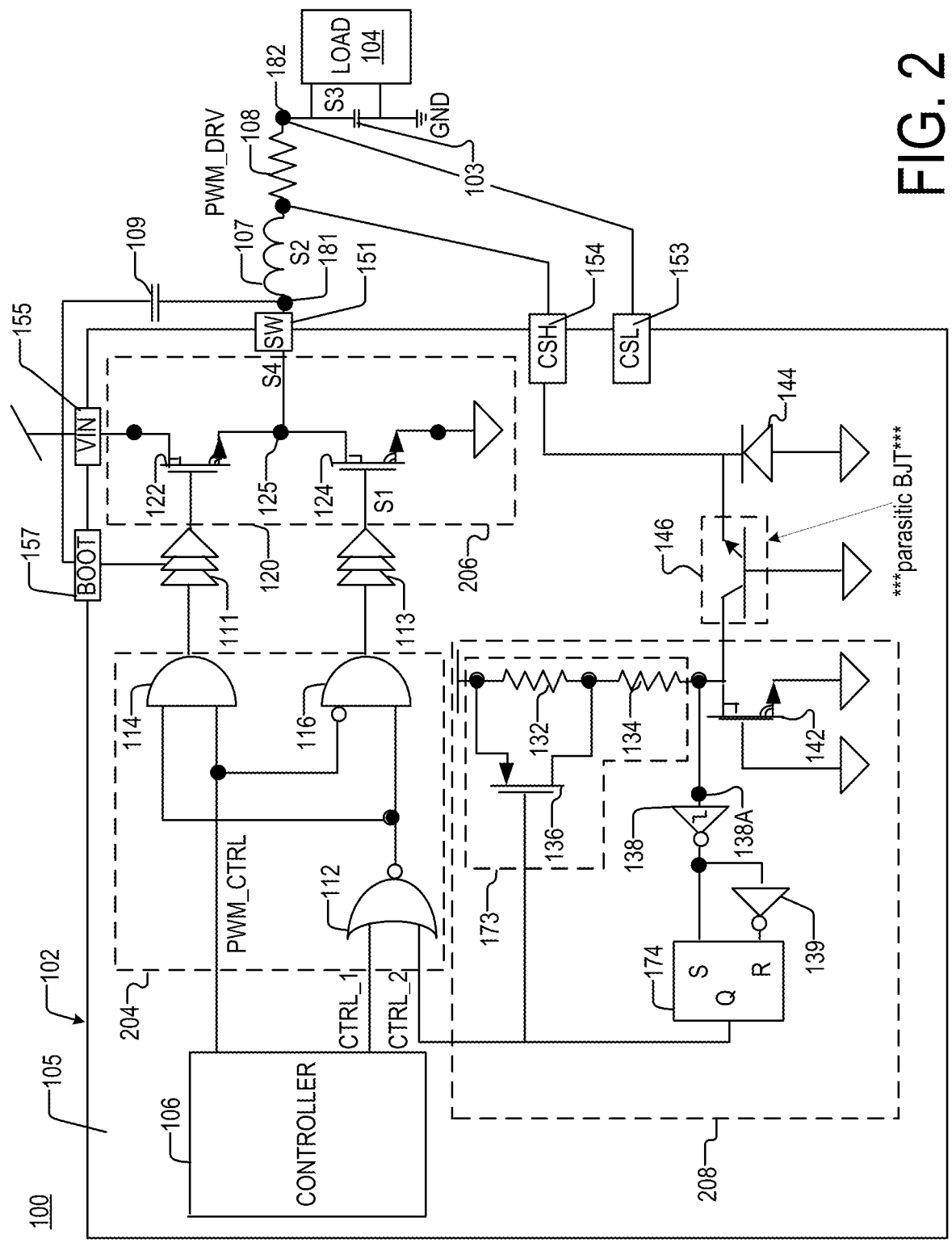
FIG. 2 is a diagram of an example of a system, according to aspects of the disclosure.

FIG. 2 illustrates one possible implementation of the driver circuit 102, according to aspects of the disclosure. The driver circuit 102 may include a controller 106, a logic gate network 204, a switching circuit 206, and a minority carrier injection limiting circuit 208. Controller 106, logic gate network 204, switching circuit 206, and circuit 208 may be formed on a substrate 105. According to the present example, substrate 105 is a silicon P-type substrate. However, the present disclosure is not limited to any specific type of substrate being used.

Controller 106 may include any suitable type of electronic circuitry. By way of example, controller 106 may include a general-purpose processor, a special-purpose processor, an application-specific circuit, etc. Although, in the present example, controller 106 is integrated into the driver circuit 102, alternative implementations are possible in which controller 106 is omitted. In such implementations, controller 106 may be provided externally of the driver circuit 102 and connected to one or more terminals (e.g., pins) of the driver circuit 102.

Logic gate network 204 may include a NOR gate 112, an AND gate 114, and an AND gate 116. One of the inputs of AND gate 116 may be inverted, as shown. The output of AND gate 114 may be coupled to a buffer 111 and the output of AND gate 116 may be coupled to a buffer 113.

Switching circuit 120 may include a half-bridge circuit comprising a high switch 122 (hereinafter "switch 122") and a low switch 124 (hereinafter "switch 124"). According to the present example, switch 122 includes a first Field effect transistor (FET), and switch 124 includes a second FET. The gate of switch 122 may be coupled to the output of buffer 111 (and/or the output of AND gate 114). The gate of switch 124 may be coupled to the output of buffer 113 (and/or the output of gate AND gate 116). The source of switch 124 may be coupled to ground. The source of switch 122 may be coupled to the drain of switch 124 at node 125. The drain of switch 122 may be coupled to voltage input terminal 155. Node 125 may be coupled to switched output terminal 151.

In operation, controller 106 may generate a control signal PWM_CTRL. Control signal PWM_CTRL may be a PWM signal. Logic gate network 204 and switching circuit 206 may generate a drive signal PWM_DRV that is used to drive the load 104. Signal PWM_DRV may have the same or similar waveform as that of signal PWM_CTRL. The logic gate network 204 may switch switches 122 and 124 on and off based on signal PWM_CTRL so as to impart the waveform of signal PWM_CTRL on the signal that is received via the voltage input terminal 155. In addition, the logic gate network 204 may disable switching circuit 206 based on control signals CTRL_1 and CTRL_2. Specifically, when one of the signals CTRL_1 and CTRL_2 is set to logic-high, logic gate network 204 may set the voltage at the gates of switches 122 and 124 to zero thus turning off the switching circuit 206. When both of signals CTRL_1 and CTRL_2 are set to logic-low, the switching circuit 206 may be enabled. Signal CTRL_1 may be set by controller 106 to disable or enable the switching circuit 206 as dictated by the logic of controller 106. Signal CTRL_2 may be set to logic-high by circuit 208 to limit the generation of injection currents in driver circuit 102 and prevent damage to components of the driver circuit 102.

Circuit 208 is provided to limit the time for which injection currents may persist in the driver circuit 102 and/or limit the time for which the ESD diode 144 conducts to ground. Circuit 208 may deliberately create a parasitic bipolar junction transistor (BJT) 146 and use the parasitic BJT 146 as a current sensing device to detect when the electrical current flowing from the anode to cathode of ESD diode 144 is above a threshold. When the threshold is exceeded, circuit 208 may stop the release of injection currents in the driver circuit 102 and/or stop the flow of electrical current through ESD diode 144 by diverting any charge that is stored in inductor 107 and/or boot capacitor 109 from the switched output terminal 151 to the voltage input terminal 155 via the body of switch 122. Specifically, circuit 208 may set signal CTRL_2 to logic-high, which causes the switch 12 to be turned off and disconnected from ground, at which current gets diverted to input terminal 155 via the switch 122 (e.g., via the body diode that inherently exists in the structure of switch 122).

As noted above, switches 124 and 122 may be turned on and off based on the value of signal PWM_CTRL. When switch 124 is turned on, the sub-circuit including inductor 107 and output capacitor 103 may begin to oscillate if the output capacitor voltage is pre-charged high. When the sub-circuit including output capacitor 103 and inductor 107 oscillates, the voltage at current sense terminals 153 and 154 may change between a positive value and a negative value. For instance, the voltage may vary between +8V and −8V. When the voltage at current sense terminals 153 and 154 falls below a threshold (e.g., 0V), the ESD diode 144 may begin to conduct from ground. While ESD diode 144 is conducting, injection currents may form in one or more parasitic devices that are present in the driver circuit 102 (i.e. parasitic devices other than parasitic BJT 146). If those injection currents persist for a long period of time, and/or if the ESD diode 144 conducts for a long period of time, components of driver circuit 102 may become damaged. In this regard, circuit 208 helps limit the duration of the injection currents and in this way reduces the likelihood of damage to the components of driver circuit 102.

Circuit 208 may include a trigger circuit 138, a feedback circuit 173, a latch 174, an inverter 139, and a transistor 142. Trigger circuit 138 may have an input 138A. Trigger circuit 138 may be configured to output a logic-high value when the voltage at input 138A is less than a threshold T, and output a logic-low value when the voltage at input 138A is above the threshold T. Trigger circuit 138 may be implemented by using a comparator, an operational amplifier, and/or any other suitable type of device. Feedback circuit 173 may include a transistor 136, a resistor 132, and a resistor 134. Feedback circuit 173 introduces hysteresis into the operation of trigger circuit 138.

Latch 174 may be provided to stabilize the output of trigger circuit 138. In other words, the output (Q) of latch 174 may be the same as the output of trigger circuit 138, so that the signal CTRL_2 is logic-high when the output of trigger circuit 138 is logic-high, and signal CTRL_2 is logic-low when the output of trigger circuit 138 is logic-low.

The set terminal(S) of latch 174 may be directly coupled to the output of trigger circuit 138. The reset terminal (R) of latch 174 may be coupled to the output of trigger circuit 138 via inverter 139. As a result of this arrangement, latch 174 is set when the output of trigger circuit 138 is logic-high and reset when the output of trigger circuit 138 is logic-low. In the present example, the output (Q) of latch 174 is signal CTRL_2. Although, in the present example, circuit 208 is provided with latch 174, alternative implementations are possible in which latch 174 is omitted. In such implementations, signal CTRL_2 may be the output of trigger circuit 138.

Figure 3:
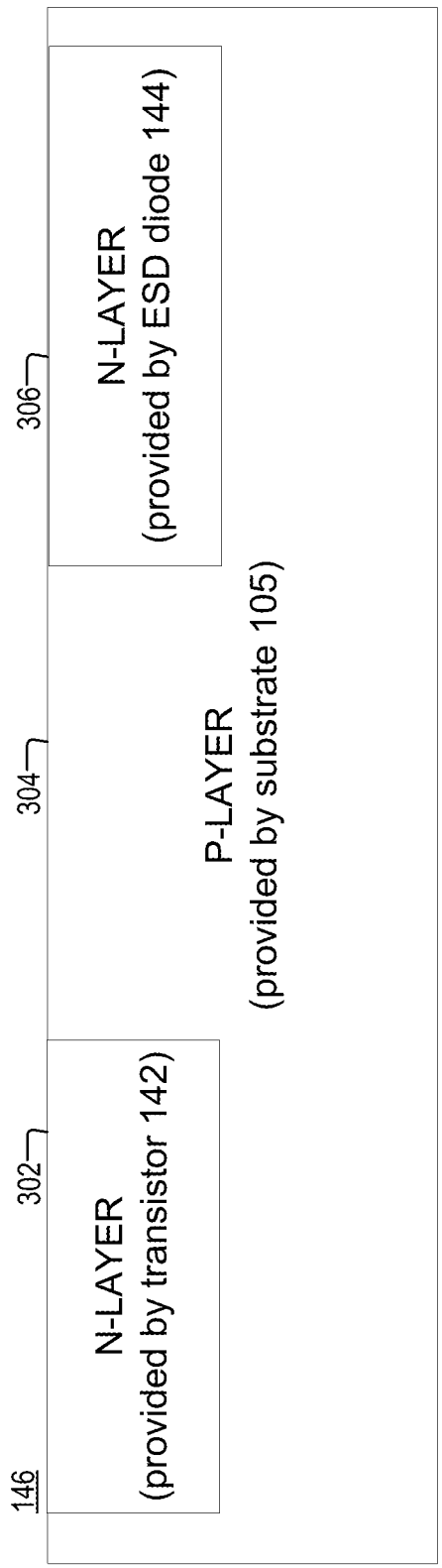
FIG. 3 is a diagram of an example of a parasitic transistor, according to aspects of the disclosure.

Transistor 142 may include a diffused metal oxide (DMOS) transistor. The source of transistor 142 may be coupled to ground, the gate of transistor 142 may be coupled to ground, and the drain of transistor 142 may be coupled to the input 138A of trigger circuit 138. Substrate 105 of driver circuit 102 is also tied to ground. Importantly, transistor 142 may form the parasitic BJT 146 together with the substrate 105 and the ESD diode 144. FIG. 3 shows parasitic BJT 146 in further detail. As illustrated in FIG. 3, parasitic BJT 146 may include a first N-layer 302, a P-substrate layer 304, and a second N-layer 306. The first N-layer 302 may be the drain of transistor 142, P-layer 304 may be a portion of the substrate 105 that is situated between the drain of transistor 142 and the cathode of ESD diode 144, and the second N-layer 306 may be the cathode of ESD diode 144. According to the present example, the first N-layer 302 is the collector of parasitic BJT 146 and the second N-layer 306 is the emitter of parasitic BJT 146. According to the present example, transistor 142 is used for the sole purpose of creating parasitic BJT 146 with its drain, and it may be referred to as a detector device or a detector transistor.

In operation, when switch 124 is on and the inductor current of system 100 flows from output capacitor 103 to SW terminal 151 the voltage at current sense terminal 154 may fall below zero. When the terminal 154 voltage falls below zero (or another predetermined threshold), inductor current of the system 100 may begin to flow from current sense terminal 154 to ground via ESD diode 144, and an injection current may begin flowing from the collector of parasitic BJT 146 to the emitter of parasitic BJT 146. When the injection current from the collector to the emitter of parasitic BJT 146 exceeds a threshold C1, parasitic BJT 146 may pull down the voltage at the input 138A of trigger circuit 138 below the threshold T of trigger circuit 138. In response, the output of trigger circuit 138 may be set to logic-high, thus causing signal CTRL_2 to be set to a logic-high value. When signal CTRL_2 is logic-high, the voltage at the respective gates of switches 122 and 124 is set to '0' (or logic-low). As a result, switches 122 and 124 are turned off, and switch 122 is disconnected from ground. When switches 122 and 124 are turned off, and switch 122 is disconnected from ground, the inductor current may begin flowing from switched output terminal 151 to voltage input terminal 155 via switch 122 (i.e., via the switch's 122's body diode), which in turn would raise the voltage at switch terminal 151 to input terminal's 155 voltage and drop the inductor current and the injection current through parasitic BJT 146 (as well as the injection currents through one or more parasitic transistors that are present in driver circuit 102). Dropping the injection current(s) is advantageous because it reduces the risk of damage to the driver circuit 102.

As the injection current through parasitic BJT 146 begins to drop, it will eventually cross a threshold C2 that is lower than C1, and which was also exceeded while the injector current was rising. When the threshold C2 is crossed (on the way down of the injector current), the voltage at the input 138A of trigger circuit 138 may rise above the threshold T of trigger circuit 138 and the output of trigger circuit 138 may be set to logic-low as a result. At this time, the value of signal CTRL_2 may also become logic-low, and the normal operation of switching circuit 206 may resume. In the present example, the trigger circuit 138 is activated when it outputs a logic-high output and deactivated when it outputs a logic-low output. In general, when the trigger circuit 138 is activated its output causes at least one of switches 122 and 124 to be turned off and when it is deactivated its output does not cause any of switches 122 and 124 to be turned off.

The difference between thresholds C1 and C2 may depend on the values of resistors 132 and 134 of feedback circuit 173. When the output of trigger circuit 138 is set to logic-high, transistor 136 is turned on, causing resistor 132 to be bypassed while in turn increasing the contribution of feedback circuit 173 to the voltage at the input 138A of trigger circuit 138. This in turn decreases the amount by which the value of the injection current needs to drop for the voltage at the input 138A of trigger circuit 138 to return to a level above the threshold T.

Figure 4:
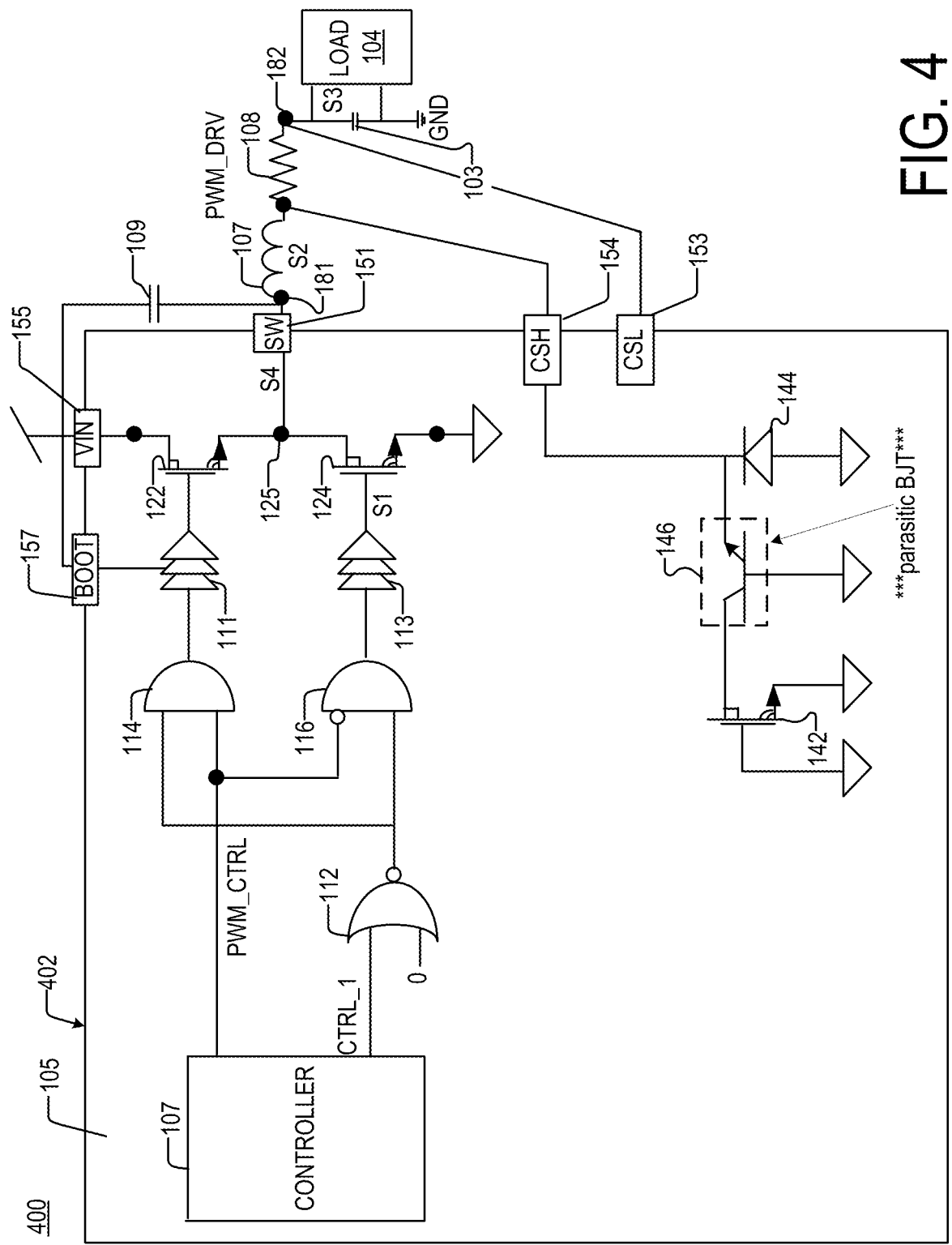
FIG. 4 is a diagram of an example of a reference system, according to aspects of the disclosure.

FIG. 4 is a diagram of a reference system 400, according to aspects of the disclosure. Reference system 400 is nearly identical to system 100, but for including a driver circuit 402. Driver circuit 402 is nearly identical to driver circuit 102, but for lacking the minority carrier injection limiting circuit 208. FIG. 4 is provided to establish a baseline for illustrating the advantageous effects of circuit 208 on the operation of driver circuit 102.

Figure 5:
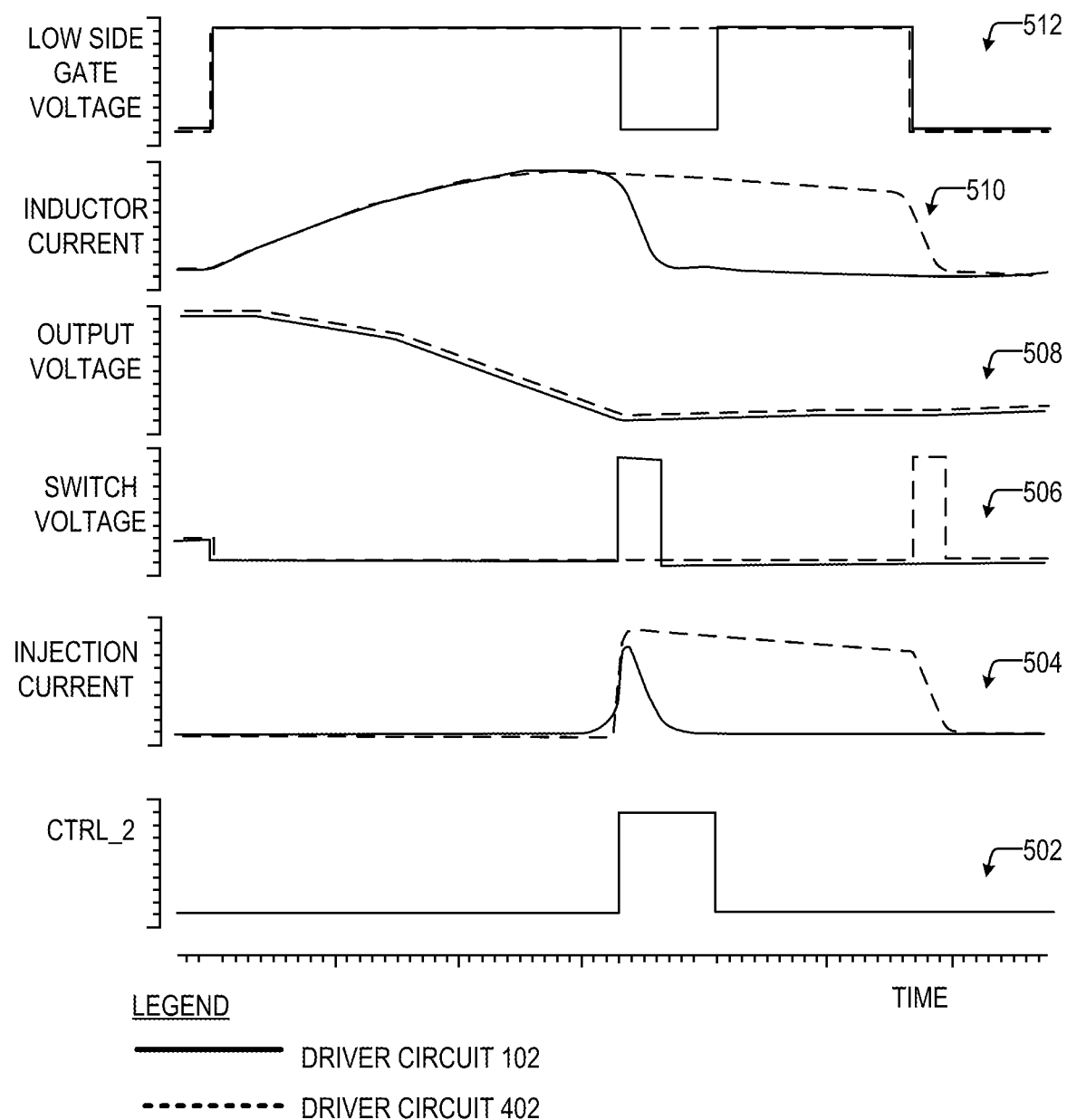
FIG. 5 shows a plurality of graphs comparing different operational parameters of the system of FIG. 2 and the reference system of FIG. 4, according to aspects of the disclosure.

FIG. 5 compares the operation of driver circuit 402 to that of driver circuit 102. Shown in FIG. 5 are graphs 502, 504, 506, 508, and 510, which include plots of different operational parameters of driver circuits 102 and 402. All plots share the same timeline. The parameters of driver circuit 102 are plotted with a solid line, and the parameters of driver circuit 402 are plotted with a dashed line.

Graph 502 shows a plot of signal CTRL_2.

Graph 504 shows plots of comparable injection currents that are generated in driver circuits 102 and 402. Graph 504 is provided to illustrate that the provision of circuit 208 may cause injection currents generated in driver circuit 102 to have a shorter duration (i.e., remain at a high level for a shorter amount of time) than they would otherwise.

Graph 506 shows plots of the voltage at terminal 151 of driver circuits 102 and 402. The switch voltage of each of driver circuits 102 and 402 is the voltage between the respective node 125 and the ground of that driver circuit—i.e., the voltage of the respective switched output terminals 151 of driver circuits 102 and 402, respectively. The voltage at terminal 151 goes high as soon as switch 124 is turned off and cause the inductor current flowing from output capacitor 103 to switch terminal 151 to drop.

Graph 508 shows plots of the output voltage of each of driver circuits 102 and 402. The output voltage of each of driver circuits 102 and 402 is the voltage across output capacitor 103 of that circuit. The output capacitor voltage decreases as the inductor current discharges it and is eventually clamped to diode voltage below zero when the ESD diode conducts all of the inductor current.

Graph 510 shows plots of the respective inductor current of each of driver circuits 102 and 402. The inductor current of each of driver circuits 102 and 402 is the electrical current that flows from node 182 to node 181 of each of driver circuits 102 and 402. Graph 510 shows that the provision of circuit 208 causes the inductor current of driver circuit 102 to fall faster than otherwise.

Graph 512 shows plots of the gate voltage of switch 124 in each of driver circuits 102 and 402, respectively. Graph 512 shows the switch 124 is turned off sooner in driver circuit 102 than in driver circuit 402. This is due to the action of circuit 208, which intervenes as soon injection current is detected through parasitic BJT 146.

Figure 6:
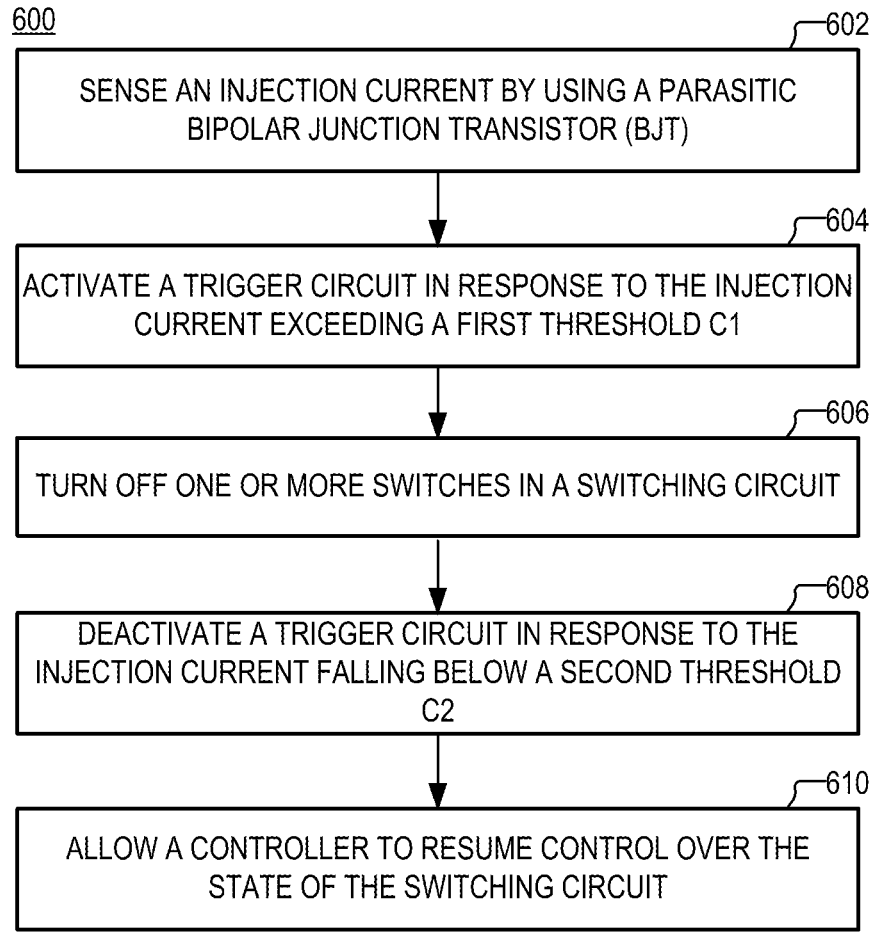
FIG. 6 is a flowchart of an example of a process, according to aspects of the disclosure.

FIG. 6 is a flowchart of an example of a process 600, according to aspects of the disclosure. According to the present example, process 600 is performed by driver circuit 102. However, the present disclosure is not limited to any specific driver circuit performing the process 600.

At step 602, an injection current in a driver circuit is sensed by using a parasitic BJT that is formed on a substrate of the driver circuit by using a detector transistor, the substrate, and an ESD diode. Sensing the injection current may include providing the parasitic BJT on the substrate, and/or configuring the driver circuit in a manner which will cause a detectable event when an injection current, greater than a predetermined threshold, flows from the collector of the parasitic BJT to the emitter of the parasitic BJT. According to the present example, the driver circuit is driver circuit 102 and the parasitic BJT is parasitic BJT 146. As discussed above, parasitic BJT 146 is arranged to pull down the voltage at the input of trigger circuit 138 below a threshold T when the injection current exceeds a threshold C1.

At step 604, a trigger circuit is activated in response to the injection current exceeding a predetermined threshold. Activating the trigger circuit may include causing the output of the trigger circuit to transition from a first value to a second value (e.g., logic-low to logic-high or vice versa). According to the present example, the activated trigger circuit is trigger circuit 138. As discussed above, trigger circuit 138 may pull down the voltage at input 138A below the threshold T in response to the injection current from the collector of the parasitic BJT 146 to the emitter of the parasitic BJT 146 exceeding a threshold C1. As noted above, pulling down the voltage below the threshold T causes the output of the trigger circuit 138 (and/or signal CTRL_2) to transition from logic-low to logic-high.

At step 606, one or more switches in a switching circuit are turned off in response to the trigger circuit being activated. As noted above, the switching circuit may include an H-bridge or a half-bridge that is arranged to drive a load, such as a motor or an LED array. According to the present example, switches 122 and 124 in switching circuit 206 are turned off. However, alternative implementations are possible in which only switch 124 is turned off.

At step 608, the trigger circuit is deactivated in response to the injection current falling below another predetermined threshold. Deactivating the trigger circuit may include causing the output of the trigger circuit to transition from the second value back to the first value (e.g., logic-high to logic-low or vice versa). According to the present example, parasitic BJT 146 causes the voltage at the input 138A of trigger circuit 138 to rise above the threshold T in response to the injection current from the collector of the parasitic BJT 146 to the emitter of the parasitic BJT 146 falling below a threshold C2. As noted above, increasing the voltage at the input 138A of trigger circuit 138 above the threshold T causes the output of the trigger circuit 138 (and/or signal CTRL_2) to transition from logic-high to logic-low.

At step 610, the one or more switches in the switching circuit are returned back to normal operation in response to the trigger circuit being deactivated. When the one or more switches in the switching circuit are returned to normal operation, controller 106 is allowed to resume control over the operation of switches 122 and 124 (because trigger circuit is no longer active and overriding controller 106 with respect to the operation of switches 122 and 124).

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, same, and opposite, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A driver circuit comprising:
a substrate;
a first terminal;
a second terminal;
a switching circuit that is formed on the substrate, the switching circuit including a first switch and a second switch, the first switch having a first drain and a first source, the second switch having a second drain and a second source, the first drain being coupled to the first terminal, the first source being coupled to the second drain, the second source being coupled to ground, and the second terminal being coupled to the first source and the second drain;
an electrostatic discharge (ESD) diode that is formed on the substrate;
a trigger circuit that is formed on the substrate, the trigger circuit being configured to divert a first electrical current when the trigger circuit is activated, the first electrical current being diverted from the second terminal to the first terminal via the first switch; and
a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT,
wherein the parasitic BJT includes, a first n-layer, a p-layer, and a second n-layer, the first n-layer being provided by a drain of the detector transistor, the p-layer being provided by the substrate, and the second n-layer being provided by a cathode of the ESD diode.

2. The driver circuit of claim 1, wherein the first electrical current is diverted through a body diode that is inherent in a structure of the first switch.

3. The driver circuit of claim 1, wherein an output of the trigger circuit is coupled to a first gate of the first switch and a second gate of the second switch, and activating the trigger circuit causes the second switch and the first switch to be turned off.

4. The driver circuit of claim 1, wherein the trigger circuit is configured to turn-off the second switch when activated.

5. The driver circuit of claim 1, wherein the first electrical current includes an inductor current.

6. A driver circuit comprising:
a substrate;
a first terminal;
a second terminal;
a switching circuit that is formed on the substrate, the switching circuit including a first switch and a second switch, the first switch having a first drain and a first source, the second switch having a second drain and a second source, the first drain being coupled to the first terminal, the first source being coupled to the second drain, the second source being coupled to ground, and the second terminal being coupled to the first source and the second drain;
an electrostatic discharge (ESD) diode that is formed on the substrate;
a trigger circuit that is formed on the substrate, the trigger circuit being configured to divert a first electrical current when the trigger circuit is activated, the first electrical current being diverted from the second terminal to the first terminal via the first switch; and
a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT, wherein the trigger circuit includes an inverted trigger circuit, and the parasitic BJT is configured to activate the trigger circuit by pulling down, below a threshold, a voltage at an input of the trigger circuit, the voltage being pulled down below the threshold when the second electrical current exceeds the first value.

7. The driver circuit of claim 6, wherein the trigger circuit includes an inverted trigger circuit, and the parasitic BJT is configured to deactivate the trigger circuit when the second electrical current exceeds and then falls below a second value, the second value being lower than the first value.

8. The driver circuit of claim 1, further comprising a controller that is configured to drive the switching circuit.

9. The driver circuit of claim 1, wherein the switching circuit includes a bridge circuit.

10. The driver circuit of claim 1, wherein the switching circuit includes a half-bridge circuit.

11. The driver circuit of claim 1, further comprising a third terminal, wherein the ESD diode is coupled between the third terminal and ground, and the second electrical current exceeds the first value when a voltage at the third terminal falls below a predetermined threshold.

12. The driver circuit of claim 11, wherein the first terminal includes an input voltage terminal, the second terminal includes a switched output terminal, and the third terminal includes a current sense terminal.

13. The driver circuit of claim 11, wherein the detector transistor includes a metal oxide semiconductor (MOS) transistor.

14. A driver circuit comprising:
a substrate;
a first terminal;
a second terminal;
a switching circuit that is formed on the substrate, the switching circuit including a first switch and a second switch, the first switch having a first drain and a first source, the second switch having a second drain and a second source, the first drain being coupled to the first terminal, the first source being coupled to the second drain, the second source being coupled to ground, and the second terminal being coupled to the first source and the second drain;
an electrostatic discharge (ESD) diode that is formed on the substrate;
a trigger circuit that is formed on the substrate, the trigger circuit being configured to divert a first electrical current when the trigger circuit is activated, the first electrical current being diverted from the second terminal to the first terminal via the first switch; and
a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT
wherein the detector transistor includes one of a diffused metal oxide semiconductor (DMOS) transistor and a laterally-diffused metal oxide semiconductor transistor (LDMOS).

15. The driver circuit of claim 1, wherein the detector transistor includes a drain, a source, and a gate, the drain being coupled to an input of the trigger circuit, the source being coupled to ground, and the gate being coupled to ground.

16. The driver circuit of claim 1, wherein the first switch includes a first Field effect transistor (FET) and the second switch includes a second FET.

17. A driver circuit comprising:
a substrate;
an input voltage terminal;
a switched output terminal;
a switching circuit that is formed on the substrate, the switching circuit being configured to receive an input voltage at the input voltage terminal and output a pulse width modulated (PWM) signal on the switched output terminal;
an electrostatic discharge (ESD) protection diode that is formed on the substrate;
a trigger circuit that is formed on the substrate, the trigger circuit being configured to cause the switching circuit to conduct a first electrical current from the switched output terminal to the input voltage terminal when the trigger circuit is activated; and
a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT,
wherein the parasitic BJT includes, a first n-layer, a p-layer, and a second n-layer, the first n-layer being provided by a drain of the detector transistor, the p-layer being provided by the substrate, and the second n-layer being provided by a cathode of the ESD diode.

18. The driver circuit of claim 17, wherein:
the switching circuit includes a first switch and a second switch, the first switch having a first drain and a first source, the second switch having a second drain and a second source, the first drain being coupled to the input voltage terminal, the first source being coupled to the second drain, the second source being coupled to ground, and the switched output terminal being coupled to the first source and the second drain; and
an output of the trigger circuit is coupled to a first gate of the first switch and a second gate of the second switch, such that activating the trigger circuit causes the second switch to be turned off.

19. The driver circuit of claim 17, wherein first electrical current is diverted through a body diode that is inherent in a structure of the first switch.

20. The driver circuit of claim 17, wherein:
the parasitic BJT is configured to activate the trigger circuit by pulling down, below a threshold, a voltage at an input of the trigger circuit, the voltage being pulled down below the threshold when the second electrical current exceeds the first value; and
the parasitic BJT is configured to deactivate the trigger circuit when the second electrical current exceeds and then falls below a second value, the second value being lower than the first value.

21. A driver circuit comprising:
a substrate;
an input voltage terminal;
a switched output terminal;
a switching circuit that is formed on the substrate, the switching circuit being configured to receive an input voltage at the input voltage terminal and output a pulse width modulated (PWM) signal on the switched output terminal;

an electrostatic discharge (ESD) protection diode that is formed on the substrate;

a trigger circuit that is formed on the substrate, the trigger circuit being configured to cause the switching circuit to conduct a first electrical current from the switched output terminal to the input voltage terminal when the trigger circuit is activated; and a detector transistor that is formed on the substrate, the detector transistor being configured to form a parasitic bipolar junction transistor (BJT) together with the substrate and the ESD diode, the parasitic BJT being configured to activate the trigger circuit when a second electrical current exceeds a first value, the second electrical current flowing from a collector of the parasitic BJT to an emitter of the parasitic BJT wherein the detector transistor includes one of a diffused metal oxide semiconductor (DMOS) transistor and a laterally-diffused metal oxide semiconductor transistor (LDMOS).

22. The driver circuit of claim 17, wherein the ESD diode is coupled between a current sense terminal of the driver circuit and ground, and the second electrical current exceeds the first value when a voltage at the current sense terminal falls below a predetermined threshold.

23. A method for use in a driver circuit, the driver circuit including a switching circuit that is coupled between an input voltage terminal and switched output terminal of the driver circuit, the switching circuit including a first switch and a second switch, the method comprising:

sensing an injection current by using a parasitic bipolar junction transistor (BJT) that is formed by using: (i) a substrate of the driver circuit, (ii) an electrostatic discharge (ESD) diode of the driver circuit, and (iii) a detector transistor that is formed on the substrate; and activating, by the parasitic BJT, a trigger circuit in response to the injection current exceeding a first threshold, wherein activating the trigger circuit includes transitioning an output of the trigger circuit from a first value to a second value; and turning off a second switch that is part of the switch circuit in response to the output of the trigger circuit transitioning to the second value, wherein turning off the second switch, at least in part, causes an inductor current to be diverted from the switched output terminal to the input voltage terminal via a first switch that is part of the switching circuit thereby reducing the inductor current, wherein the parasitic BJT includes, a first n-layer, a p-layer, and a second n-layer, the first n-layer being provided by a drain of the detector transistor, the p-layer being provided by the substrate, and the second n-layer being provided by a cathode of the BSD diode.

24. The method of claim 23, further comprising:

deactivating the trigger circuit, by the parasitic BJT, in response to the injection current exceeding and then falling below a second threshold that is lower than the first threshold, wherein deactivating the trigger circuit causes the output of the trigger circuit to return back to the first value thus allowing the controller to resume full control over operation of switching circuit.

25. The method of claim 23, wherein:

the switching circuit includes a first switch and a second switch, the first switch having a first drain and a first source, the second switch having a second drain and a second source, the first drain being coupled to the input voltage terminal, the first source being coupled to the second drain, the second source being coupled to ground, and the switched output terminal being coupled to the first source and the second drain; and an output of the trigger circuit is coupled to a gate of the second switch.

* * * * *